United States Patent
Hwang et al.

(10) Patent No.: US 10,211,105 B2
(45) Date of Patent: Feb. 19, 2019

(54) APPARATUS FOR CUTTING SUBSTRATE AND SYSTEM FOR PROCESSING SAME

(71) Applicant: National Taiwan University of Science and Technology, Taipei (TW)

(72) Inventors: Bing-Joe Hwang, Taipei (TW); Wei-Nien Su, Taipei (TW); Jeng-Ywan Jeng, Taipei (TW); Yuan-Han Chu, Taipei (TW); Tse-Ming Chiu, Taipei (TW); Hsin-Fu Teng, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 0 days.

(21) Appl. No.: 15/816,247

(22) Filed: Nov. 17, 2017

(65) Prior Publication Data

US 2018/0076089 A1    Mar. 15, 2018

Related U.S. Application Data

(62) Division of application No. 15/015,061, filed on Feb. 3, 2016, now Pat. No. 9,852,948.

(30) Foreign Application Priority Data

Feb. 6, 2015 (TW) .............................. 104104167 A

(51) Int. Cl.
| | |
|---|---|
| *H01L 21/306* | (2006.01) |
| *H01L 21/78* | (2006.01) |
| *B28D 5/04* | (2006.01) |
| *H01L 21/3063* | (2006.01) |

(52) U.S. Cl.
CPC ............... *H01L 21/78* (2013.01); *B28D 5/04* (2013.01); *H01L 21/306* (2013.01); *H01L 21/3063* (2013.01); *H01L 21/30604* (2013.01)

(58) Field of Classification Search
CPC .. H01L 21/30604; H01L 21/3063; B28D 5/04
See application file for complete search history.

(56) References Cited

U.S. PATENT DOCUMENTS

| 5,180,469 A | 1/1993 | Abe | |
|---|---|---|---|
| 2010/0035435 A1* | 2/2010 | Tews ......................... | C23F 1/18 438/754 |
| 2010/0193362 A1* | 8/2010 | Warabisako ........ | H01L 31/1804 205/50 |

FOREIGN PATENT DOCUMENTS

| CN | 593300 A | 4/1993 |
|---|---|---|
| CN | 101453014 A | 6/2009 |
| CN | 103187589 B | 7/2013 |
| JP | 2008243838 A | 10/2008 |

(Continued)

OTHER PUBLICATIONS

Office Action issued in corresponding Taiwanese Patent Application No. 104104167 dated Oct. 3, 2016, consisting of 7 pp.

(Continued)

*Primary Examiner* — Cuong Q Nguyen
(74) *Attorney, Agent, or Firm* — Volpe and Koenig, P.C.

(57) ABSTRACT

An apparatus for cutting a substrate is disclosed. The apparatus includes a main body containing a reactive solution and the substrate; and a catalytic cutting element disposed inside the main body and contacting one of at least two adjacent cutting peripheries of the substrate to conduct a chemical reaction to cut the substrate.

20 Claims, 7 Drawing Sheets

(56) References Cited

FOREIGN PATENT DOCUMENTS

| | | | |
|---|---|---|---|
| JP | 2010274399 | A | 12/2010 |
| TW | 200908148 | A | 2/2009 |
| TW | M403510 | U1 | 5/2011 |
| TW | 201338030 | A | 9/2013 |

OTHER PUBLICATIONS

Office Action issued in corresponding Japanese Patent Application No. 20161004229.X dated Apr. 19, 2017.

* cited by examiner

APPARATUS FOR CUTTING SUBSTRATE AND SYSTEM FOR PROCESSING SAME

CROSS REFERENCE

This application is a division of U.S. patent application Ser. No. 15/015,061, filed Feb. 3, 2016, the disclosures of which are incorporated herein in their entirety by reference.

FIELD OF THE INVENTION

The present invention is related to a method of substrate processing. In particular, the present invention is related to a method of cutting a substrate through chemical reactions.

BACKGROUND OF THE INVENTION

For years, the method of obtaining wafers from a silicon ingot was by using diamond wire cutting, which is a mechanical process. Although equipped with nearly fully-automated production equipment, the production lines in the industry still inevitably generate considerable wafer material loss, and considerable amount of water, electricity and consumables (such as diamond cutting fluids and metal cutting wires, etc.) are also required. Therefore, the wafer cutting process has become one of the key processes for wafer processing in pursuit of lower cost.

In addition, regarding the process of manufacturing gallium nitride light-emitting diodes (LEDs) on a surface of a substrate, sapphire is the most common substrate. However, the processing of sapphire is relatively difficult and time-consuming due to the intrinsic properties of the material. There is a great demand of technologies which is capable of replacing existing processes. Silicon has been extensively used in various semiconductor, electro-optical, photovoltaic industries for years. Silicon has thus emerged as one of the alternative materials to replace sapphire substrate. In order to improve the material properties such as the differences in lattice constant as well as the thermal expansion coefficient between the LED materials (such as gallium nitride) and the silicon substrate, the epiaxial growth of the LED material should be thoughtfully controlled. Processing and even making patterns on the silicon substrate surface might offer a solution to this technical challenge. The lithography process with photo masks is currently used to create patterns on the surface of a silicon substrate. However, the facility and operational costs of the lithography process for putting a pattern on silicon substrate surfaces are extremely high, and it makes the cost reduction of LED products difficult.

In order to overcome the drawbacks in the prior art, the present invention introduces a novel cost-effective method of substrate processing. The particular design in the present invention not only solves the aforementioned problems, but is also easy to implement. Thus, the present invention has utility for the industry.

SUMMARY OF THE INVENTION

A novel cost-effective method of substrate processing is disclosed. In accordance with one aspect of the present invention, a method of processing a substrate is disclosed. The method includes the following steps: providing a substrate body having a surface; placing a die on the surface, wherein the die acts as a catalyst; immersing the substrate body and the die in a reaction solution; and processing the substrate body via a chemical reaction occurring on the surface through the reaction solution and the catalyst.

In accordance with another aspect of the present invention, an apparatus for cutting a silicon ingot is disclosed. The apparatus comprises a main body containing a reaction solution and the silicon ingot, wherein the silicon ingot includes at least two adjacent cutting peripheries, and the at least two adjacent cutting peripheries define therebetween a silicon wafer; and a cutting catalyst element disposed inside the main body, and contacting one of the at least two adjacent cutting peripheries to cut the silicon ingot.

In accordance with a further aspect of the present invention, a method of forming a pattern on a non-conductive substrate is disclosed, comprising the steps of: (a) providing a substrate body having a surface; and (b) forming the pattern on the surface via a catalytic reaction.

The objectives and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to note that the following descriptions of the preferred embodiments of this invention are presented herein for the purposes of illustration and description only; they are not intended to be exhaustive or to be limited to the precise form disclosed.

The present invention makes use of a chemical reaction, particularly with the aid of a catalyst, to cut an ingot to obtain wafers or substrates, or to form patterns on a surface of a substrate. The material of the ingot or the substrate can be silicon or gallium nitride. Compared to the traditional mechanical process of ingot dicing, slicing and wafering, the present invention can increase the processing efficiency, improve the surface roughness of the substrates and reduce material losses during the sawing process.

Figure 1A:
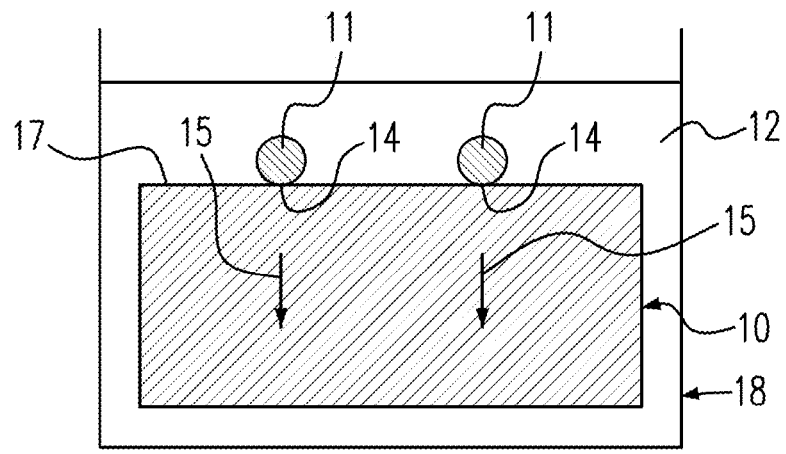
FIG. 1A-1C are schematic diagrams showing the apparatus and method for processing a substrate according to one embodiment of the present invention.
Figure 1B:
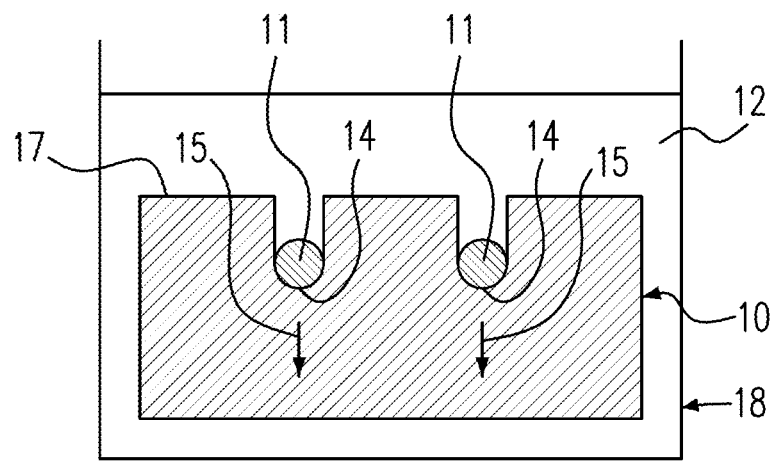
Figure 1C:
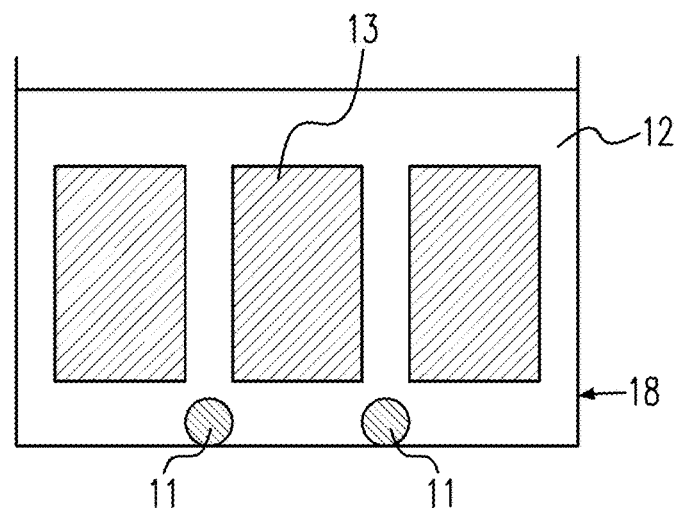

Please refer to FIGS. 1A-1C, which show schematic diagrams of the apparatus and method for processing a substrate according to one embodiment of the present invention. According to FIG. 1, a main body 18 contains reaction solution 12 and the substrate 10 to be cut. At least a cutting catalyst element or cutting die 11 is disposed on the surface 17 of the substrate 10. It can be observed that both the substrate 10 and the die 11 are immersed in the reaction solution 12, which contains an etching solution. With the cutting die 11 acting as catalyst and contacting the substrate 10 at the contact surface 14, an etching process on the surface 17, more specifically at the contact surface 14, takes place via a chemical reaction occurring. As time goes by, the contact surface 14 will move along the direction 15 which is downward in the illustration of FIG. 1A due to gravity, and eventually the substrate 10 will be cut through by the cutting die 11, as illustrated in FIG. 1B-1C. If two cutting dies 11 are configured on the surface 17 of the substrate 10, at least a wafer 13 can be obtained after the cutting process is completed. Notably, the substrate 10 can be a silicon ingot, so the mentioned process can be used to cut wafers out of the silicon ingot. For better contact between the cutting dies 11 and the substrate 10 at the contact surfaces 14, a pressure source (not shown) providing pressure upon the substrate 10 can be added to the cutting dies 11 to facilitate the cutting process.

According to another embodiment of the present invention, the cutting dies 11 can be disposed underneath the substrate 10 so that gravity caused by the weight of the substrate 10 can provide pressure upon the contact surfaces (not shown) between the cutting dies 11 and the substrate 10 for better contact therebetween. If necessary, a pressure source (not shown) providing pressure can be added to the substrate 10 to enhance the completion of the cutting process. In some embodiments, the cutting dies 11 can take the shape of lines.

Figure 1D:
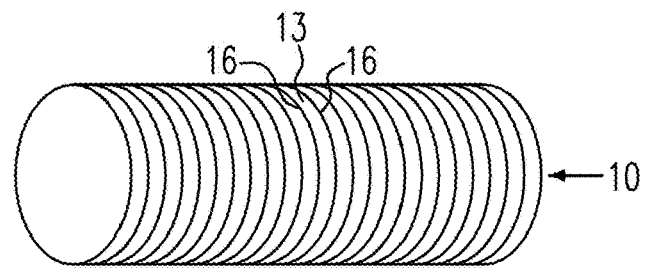
FIG. 1D is a schematic diagram showing an embodiment of slicing a wafer out of a substrate or a silicon ingot.

Please refer to FIG. 1D, which is a schematic diagram showing an embodiment of slicing a wafer out of a substrate or a silicon ingot. According to FIG. 1D, the substrate 10 has at least two adjacent cutting peripheries 16, which define therebetween a silicon wafer 13. The cutting die 11 is disposed inside the main body 18, and contacts one of the at least two adjacent cutting peripheries 16 to cut the substrate 10, which is a silicon ingot in one embodiment. Repeating this process, a silicon ingot can be sliced into wafers piece by piece. This manner can obtain wafers from an ingot without sacrificing much material during the cutting process, because the cutting catalyst element can be formed as a very thin wire which is much thinner than traditional diamond saws.

Please again refer to FIGS. 1A-1C. The method of cutting a substrate 10 according to the present invention includes the following steps: (1) cleaning the surface of the substrate 10; (2) mixing hydrofluoric acid (acting as an etching solution) with hydrogen peroxide (acting as an oxidant) in an appropriate ratio to form the reaction solution 12. If necessary, further additives, such as coordination agent, capping agent, ligands, protective agents, etching accelerator (e.g., glycine, lysine, copper sulfate, copper nitrate, copper chloride and the like), or other oxidants (e.g., ozone) can be included; (3) adjusting and maintaining the reaction solution 12 under weak acidic conditions; (4) using a cutting die 11 such as a metal wire (a silver wire is employed in the present embodiment, while platinum, copper, iridium, palladium, gold, stainless steel wires and a combination thereof, or even a metal wire plated with silver, platinum, copper, iridium, palladium, gold or stainless steel can be also applicable) with a diameter of 0.5 millimeter as a catalyst; (5) immersing the cutting die 11 and the substrate 10 into the reaction solution 12 and causing the cutting die 11 to contact a surface 17 of the substrate 10 to process the substrate body via a chemical reaction occurring on the surface 17. Meanwhile, to improve the cutting conditions and cutting quality, the proposed method may also include steps of measuring the etching depth on the substrate body to calculate the etching speed and measuring the roughness of the cutting surface.

In an exemplary embodiment, the material of the cutting die 11 can be silver or any other catalytic metal, the reaction solution 12 can be a mixture of hydrogen peroxide and hydrofluoric acid, and the substrate 10 is a silicon ingot. The chemical reactions are represented by the following formulae:

Formula (1): the chemical reaction mechanism with silver as the catalyst:

$$2H_2O_2 + Si \overset{Ag}{\rightleftarrows} SiO_2 + 2H_2O$$

Formula (2): the chemical reaction mechanism for etching with hydrofluoric acid:

$$SiO_2 + 6HF \rightleftarrows H_2SiF_6 + 2H_2O$$

Formula (3): the overall reaction formula:

$$Si + 2H_2O_2 + 6HF \rightleftarrows H_2SiF_6 + 4H_2O$$

Notably, other metals such as platinum, copper, iridium, palladium, gold, stainless steel or a combination thereof are also applicable to act as the catalyst, and the etching solution may also include sulfuric acid, hydrochloric acid, nitric acid or a combination thereof. Based on the same concept, substrates made of sapphire, silicon carbide, gallium nitride or other non-conductive materials can be processed according to the present invention.

Figure 2:
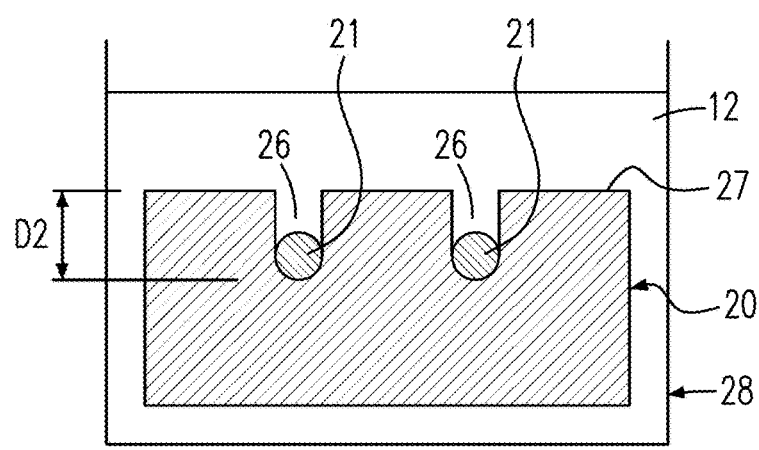
FIG. 2 shows another embodiment of the apparatus and method for processing a substrate according to the present invention.

Please refer to FIG. 2, which shows another embodiment of the apparatus and method for processing a substrate according to the present invention. In FIG. 2, the apparatus 28 is a processing apparatus for forming a pattern on the surface 27 of the silicon wafer 20. When the cutting dies 21, which are one-dimensional objects such as metal wires, are disposed on the silicon wafer 20 and contact the silicon wafer 20 at the surface 27, the silicon wafer 20 will be cut because of the same chemical reaction as set forth above. After the silicon wafer 20 is etched to a certain depth D2, the cutting dies 21 are removed and trenches 26 are formed on the silicon wafer 20. When the cutting die 21 is a two-dimensional object such as a grid-like die, the method according to the embodiment as illustrated in FIG. 2 results in a grid-like pattern on the surface 27 of silicon wafer 20. The process characterized by the creation of surface features on the surface 27 where the surface features are reversely identical to the original feature on the cutting die 21.

Figure 3A:
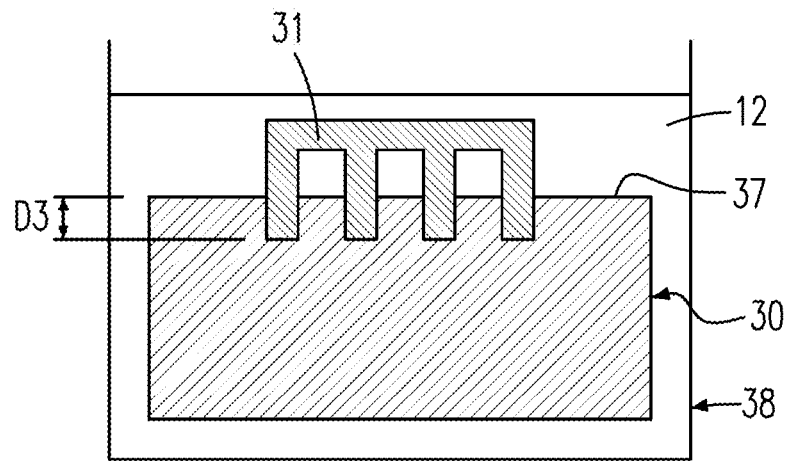
FIG. 3A shows yet another embodiment of the apparatus and method for processing a substrate according to the present invention.

Please refer to FIG. 3A, which shows another embodiment of the apparatus and method for processing a substrate according to the present invention. In FIG. 3, the apparatus 38 is a processing apparatus for forming a pattern on the surface 37 of the silicon wafer 30. When the hollow die 31, which is a three-dimensional object such as a hollow die, is disposed on the silicon wafer 30 and contacts the silicon wafer 30 at the surface 37, the silicon wafer 30 will be cut through the same chemical reaction as set forth above. After the silicon wafer 30 is etched to a certain depth D3, the hollow die 31 is removed away and a three-dimensional pattern is formed on the silicon wafer 30. If a cutting die having a rough surface pattern is employed in the cutting process, the corresponding rough surface pattern can be formed on the silicon wafer 30.

Figure 3B:
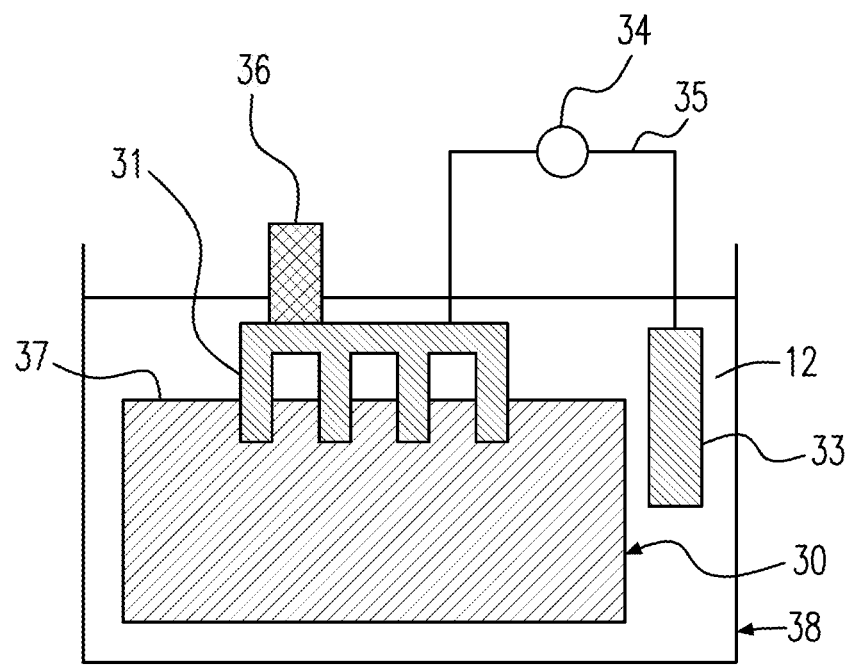
FIG. 3B shows a further embodiment of the apparatus and method for processing a substrate according to the present invention.

In addition, referring to FIG. 3B, a counter electrode 33 can be disposed in opposite to the hollow die 31 in the reaction solution 12, and an electric power supply 34 is added on the circuit 35 connecting to the hollow die 31 and the counter electrode 33 to provide an electric power thereto to either accelerate the chemical reaction or prevent the hollow die 31 from corrosion. The electric power supply (not shown) can either provide a constant voltage or a constant current to the system. In one embodiment, the hollow die 31 may act as an anode while the counter electrode 33 acts as a cathode and the electric power can accelerate the etching process to the silicon wafer 30. In another embodiment, the hollow die 31 may act as a cathode anode while the counter electrode 33 an anode, the electric power can prevent the hollow die 31 from corrosion due to the theory of cathode protection, and therefore the catalyst service life of the hollow die 31 can be extended.

Referring again to FIG. 3B, pressure can be applied to the contact areas between the hollow die 31 and the silicon wafer 30 by disposing a weight 36 on top of the hollow die 31 for better contact conditions between the hollow die 31 and the silicon wafer 30 to ensure the etching quality.

Likewise, similar to the prior-described embodiment, the silicon wafer 30 can be alternatively disposed on top of the hollow die 31, so that gravity due to the weight of the silicon wafer 30 provides pressure to the contact surfaces between the hollow die 31 and silicon wafer 30 for better contact therebetween. If necessary, the weight 36 or another type of pressure source can also be disposed on top of the silicon wafer 30 in this configuration.

Table 1 shows the formulae of the reaction solution 12 versus results. As illustrated in Table 1, the silicon ingot can be smoothly sliced under proper etching conditions with an appropriate oxidant. As the concentration of hydrogen peroxide rises, the dissolution rate of the silver wire decreases, and thus the consumption of silver is reduced.

TABLE 1

| Formula | Hydrofluoric acid (Volume Percentage) | Hydrogen peroxide (Volume Percentage) | Silver dissolution rate (Milligram/ $cm^2$/hour) |
| --- | --- | --- | --- |
| 1 | 5% | 20% | Nearly 223 |
| 2 | 5% | 10% | Nearly 289 |
| 3 | 5% | 5% | Nearly 447 |

Figure 4:
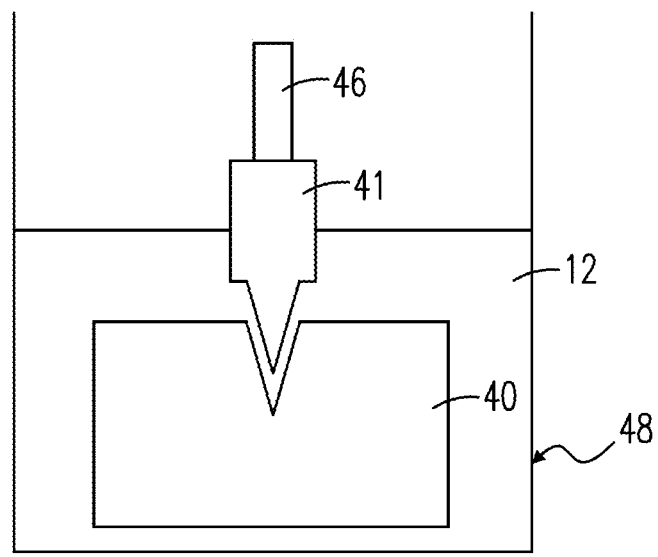
FIG. 4 shows yet another embodiment of the apparatus and method for processing a substrate according to the present invention.

Please refer to FIG. 4, which shows yet another embodiment of the apparatus and method for processing a substrate according to the present invention. This embodiment uses a pyramid-shaped die 41 in the reaction solution 12, and etches the wafer 40 through the pressure due to gravity from the weight 46 disposed on top of the pyramid-shaped die 41 which results in a pattern with a counter-pyramid shape on the wafer 40.

Figure 5A:
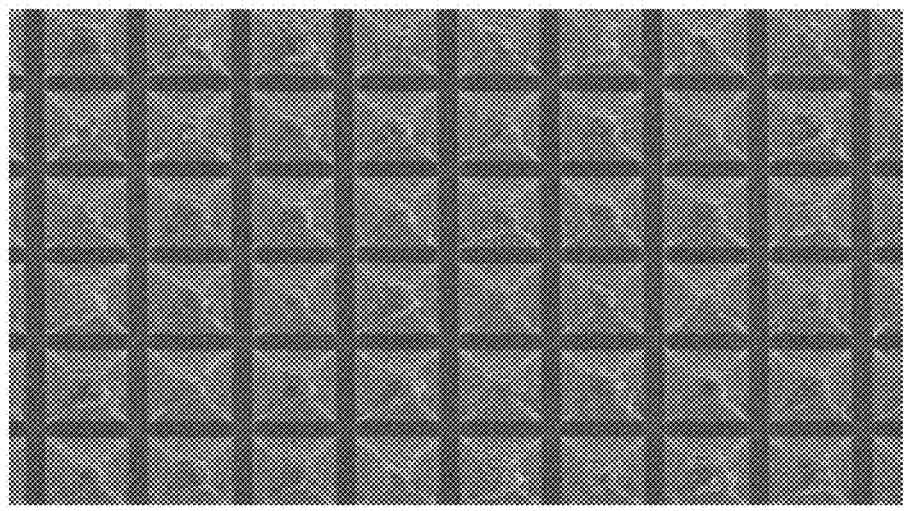
FIG. 5A is an SEM picture of a die which is a matrix composed of pyramid-shaped dies.
Figure 5B:
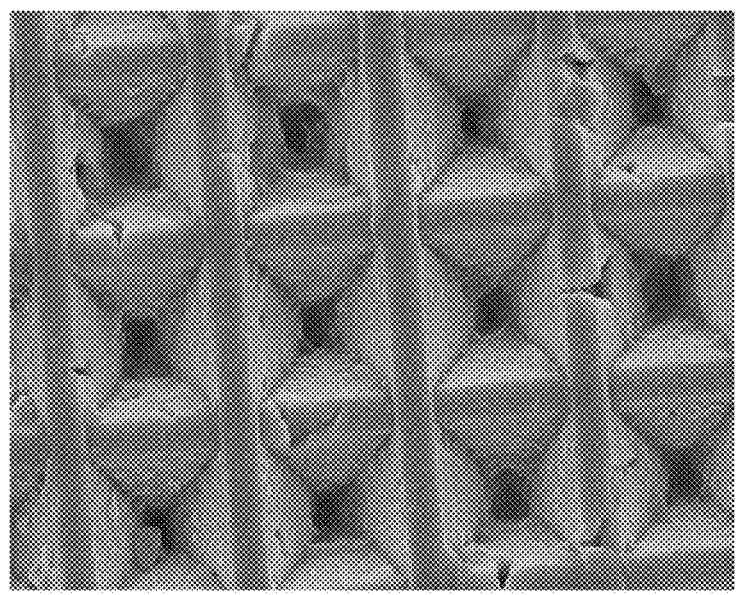
FIG. 5B shows an SEM picture of the pattern made with the die shown in FIG. 5A.

FIG. 5A shows a picture of the die which is a matrix composed of pyramid-shaped dies as shown in the embodiment of FIG. 4. The picture is taken by a scanning electron microscope (SEM). FIG. 5B shows the SEM picture of the pattern made with the die as shown in FIG. 5A.

Figure 6A:
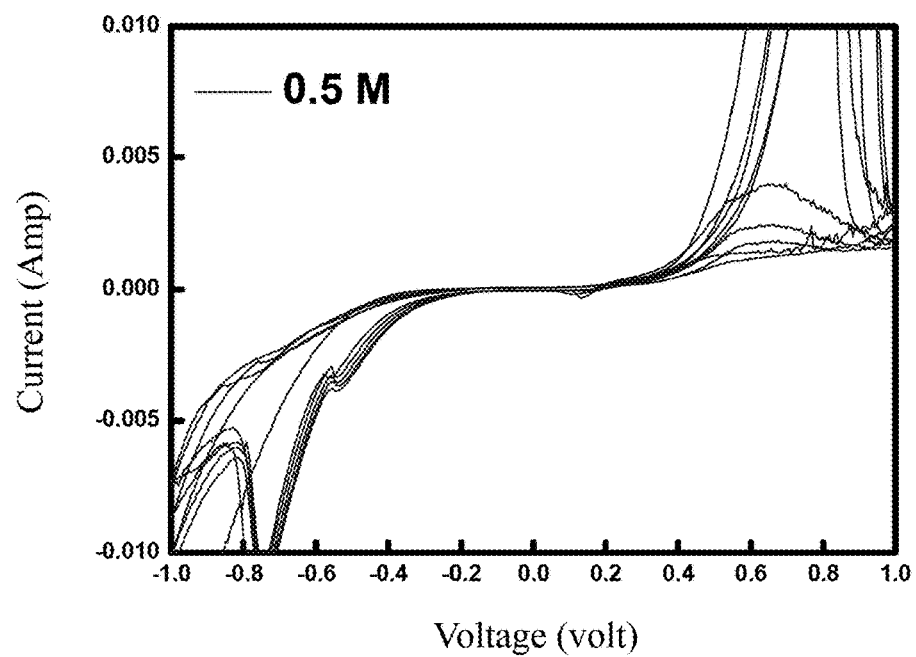
FIGS. 6A-6C shows curves related to the cycles of current versus potential obtained through a cyclic voltammetry test.
Figure 6B:
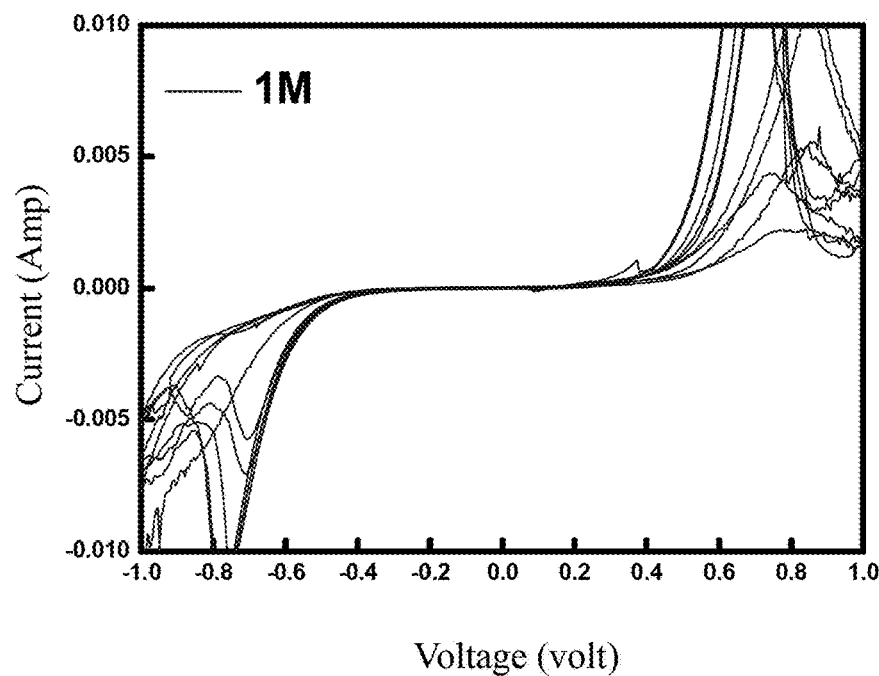
Figure 6C:
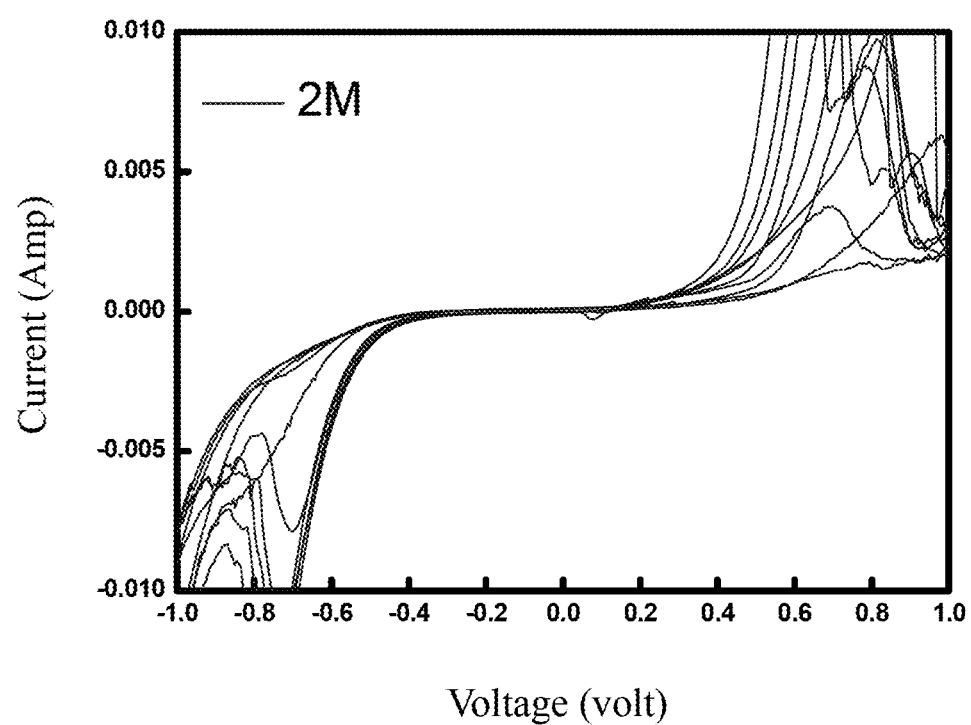

According to one embodiment, sulfuric acid can be use to replace hydrofluoric acid as the etching solution. In this embodiment, sulfuric acid in various concentrations (0.5 M, 1M and 2M) is utilized, a silver wire is used as the working electrode, and a graphite rod is employed as the counter electrode. Via an electrochemical cyclic voltammetry (CV) test, curves in cycles of current versus potential (corresponding to the counter electrode) when the reduction and oxidation reactions occur are as shown in FIGS. 6A-6C. Based on the high symmetry of the oxidation and reduction peaks of the curves to determine the reversibility of the chemical reaction, the illustrations help the skilled person in the art to understand the electrochemical characteristics of the reactive liquid used in the embodiments, whereby it can be used to design or improve the formulation of the reaction fluid and the accelerating or inhibiting process.

In addition, neither the photo-lithography technique nor a photomask is required to implement the present invention. Therefore, the present invention reduces the investment cost for production facilities. Furthermore, the methods according to the present invention can be adopted to generate one-dimensional, two-dimensional or three-dimensional patterns on a substrate with ease.

Embodiments

1. A method of processing a substrate, comprising steps of: (a) providing a substrate body having a surface; (b) placing a die on the surface, wherein the die acts as a catalyst; (c) immersing the substrate body and the die in a reaction solution; and (d) processing the substrate body via a chemical reaction occurring on the surface through the reaction solution and the catalyst.

2. The method of Embodiment 1, further comprising steps of disposing a counter electrode in opposite to the die in the reaction solution; and providing an electric power to the die and the counter electrode.

3. The method of Embodiment 2, further comprising a step of when the die acts as an anode, applying one of a constant voltage and a constant current to the die to accelerate the chemical reaction.

4. The method of Embodiment 2, further comprising a step of when the die acts as a cathode, applying one of a constant voltage and a constant current to the die to prevent the die from corrosion.

5. The method of the previous embodiments, wherein the reaction solution includes an etching solution being one selected from a group consisting of a hydrofluoric acid, a sulfuric acid, a hydrochloric acid, a nitric acid and a combination thereof.

6. The method of the previous embodiments, wherein the reaction solution includes an oxidant being one of a hydrogen peroxide and an ozone.

7. The method of the previous embodiments, wherein the reaction solution includes an etching additives being one selected from a group consisting of a glycine, a lysine, a copper sulfate, a copper nitrate, a copper chloride and a combination thereof.

8. The method of the previous embodiments, wherein the die is one object selected from the group consisting of one-dimensional, two-dimensional and three-dimensional objects.

9. The method of the previous embodiments, wherein the die has a surface being a metal selected from a group consisting of a silver, a platinum, a copper, an iridium, a palladium, a gold, a stainless steel and a combination thereof.

10. The method of the previous embodiments, wherein the substrate body includes a material being one selected from a group consisting of a silicon, a sapphire, a silicon carbide and a gallium nitride.

11. The method of the previous embodiments, wherein the processing step includes one of the following steps: forming a pattern on the surface of the substrate body; and performing a cutting to the substrate body.

12. An apparatus for cutting a silicon ingot, comprising a main body and a cutting catalyst element. The main body contains a reaction solution and the silicon ingot, wherein the silicon ingot includes at least two adjacent cutting peripheries, and the at least two adjacent cutting peripheries define therebetween a silicon wafer. The cutting catalyst element is disposed inside the main body, and contacts one of the at least two adjacent cutting peripheries to cut the silicon ingot.

13. The apparatus of Embodiment 12, wherein the cutting catalyst element includes a metal wire acting as a catalyst and being one selected from a group consisting of a silver, a platinum, a copper, an iridium, a palladium, a gold, a stainless steel and a combination thereof.

14. The apparatus of Embodiment 12, wherein the reaction solution includes an etching solution being one selected from a group consisting of a hydrofluoric acid, a sulfuric acid, a hydrochloric acid, a nitric acid and a combination thereof.

15. The apparatus of Embodiment 12, wherein the reaction solution includes an oxidant being one of a hydrogen peroxide and an ozone.

16. The apparatus of Embodiment 13, further comprising a pressure source providing a pressure against the silicon ingot; and an etching solution cutting the silicon ingot by using the metal wire.

17. The apparatus according to claim 12, further comprising a counter electrode in opposite to the cutting catalyst element and disposed inside the main body.

18. A method of forming a pattern on a non-conductive substrate, comprising steps of: (a) providing a substrate body having a surface; and (b) forming the pattern on the surface via a catalytic reaction.

19. The method of Embodiment 18, further comprising a step of providing an etching solution and a metal die, wherein the catalytic reaction occurs at a contact surface where the metal die contacts the surface of the body, the substrate body acts as a reactant, the metal die acts as a catalyst; and when the contact surface proceeds with the catalytic reaction, the pattern is formed on the contact surface.

20. The method of Embodiment 19, further comprising steps of disposing a counter electrode in opposite to the metal die in the etching solution; and providing an electric power to the metal die and the counter electrode.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. An apparatus for cutting a substrate, wherein the substrate includes at least two adjacent cutting peripheries defining therebetween a silicon wafer, the apparatus comprising:
a main body containing a reactive solution and the substrate; and
a catalytic cutting element disposed inside the main body, and contacting one of the at least two adjacent cutting peripheries to conduct a chemical reaction to cut the substrate, wherein the substrate has a surface, the catalytic cutting element includes an inner material and an outer material disposed on the surface, the outer material is a first metal used as a catalyst, and the inner material is a second metal which is different from the first metal.

2. The apparatus according to claim 1, wherein the catalytic cutting element includes a metal wire acting as a catalyst and having a first material selected from a group consisting of a silver, a platinum, a copper, an iridium, a palladium, a gold, a stainless steel and a combination thereof.

3. The apparatus according to claim 1, wherein the reactive solution includes an etching solution being one selected from a group consisting of a hydrofluoric acid, a sulfuric acid, a hydrochloric acid, a nitric acid and a combination thereof.

4. The apparatus according to claim 3, further comprising a pressure source providing a pressure upon the substrate, wherein the etching solution cuts the substrate by using the metal wire.

5. The apparatus according to claim 1, further comprising a counter electrode disposed inside the main body and opposite to the catalytic cutting element.

6. The apparatus according to claim 5, further comprising a power supply connected to the catalytic cutting element and the counter electrode.

7. The apparatus according to claim 6, wherein when the catalytic cutting element acts as an anode, the power supply supplies one of a constant voltage and a constant current to the catalytic cutting element to accelerate the chemical reaction, and when the catalytic cutting element acts as a cathode, the power supply supplies one of a constant voltage and a constant current to the catalytic cutting element to prevent the catalytic cutting element from corrosion.

8. The apparatus according to claim 1, wherein the reactive solution further includes at least one of an oxidant and an etching accelerator.

9. The apparatus according to claim 8, wherein the oxidant is one of a hydrogen peroxide and an ozone.

10. The apparatus according to claim 8, wherein the etching accelerator is one selected from a group consisting of a glycine, a lysine, a copper sulfate, a copper nitrate, a copper chloride and a combination thereof.

11. The apparatus according to claim 1, wherein the catalytic cutting element is one object selected from the group consisting of one-dimensional, two-dimensional and three-dimensional objects.

12. The apparatus according to claim 1, wherein the catalytic cutting element has a surface formed of a metal selected from a group consisting of a silver, a platinum, a copper, an iridium, a palladium, a gold, a stainless steel and a combination thereof.

13. The apparatus according to claim 1, wherein the substrate has a second material being one selected from a group consisting of a silicon, a sapphire, a silicon carbide and a gallium nitride.

14. The apparatus according to claim 1, wherein the substrate is an ingot.

15. A system for processing a substrate, comprising:
a main body containing the substrate having a first surface; and
a catalytic die disposed inside the main body, and contacting the first surface to proceed with one of cutting the substrate and forming a pattern on the first surface, wherein the catalytic cutting element includes an inner material and an outer material disposed on the first surface, the outer material is a first metal used as a catalyst, and the inner material is a second metal which is different from the first metal.

16. The system according to claim 15, further comprising a pressure source providing a pressure upon the first surface through the catalytic die.

17. The system according to claim 15, further comprising a reactive solution cutting the substrate by using the catalytic die.

18. The system according to claim 17, wherein the reactive solution includes an etching solution.

19. The system according to claim 15, wherein the catalytic die is one object selected from the group consisting of one-dimensional, two-dimensional and three-dimensional objects.

20. The system according to claim 15, wherein the catalytic die has a second surface formed of a metal selected from a group consisting of a silver, a platinum, a copper, an iridium, a palladium, a gold, a stainless steel and a combination thereof.

* * * * *